May 5, 1970 TAKANORI SHIGIHARA 3,510,778

COMBINED AM-FM RECEIVER

Filed July 7, 1965 2 Sheets-Sheet 1

INVENTOR
TAKANORI SHIGIHARA

BY Darby & Darby

ATTORNEYS

May 5, 1970 TAKANORI SHIGIHARA 3,510,778

COMBINED AM-FM RECEIVER

Filed July 7, 1965 2 Sheets-Sheet 2

INVENTOR
TAKANORI SHIGIHARA

BY

ATTORNEYS

United States Patent Office 3,510,778
Patented May 5, 1970

3,510,778

COMBINED AM-FM RECEIVER

Takanori Shigihara, Daito-shi, Japan, assignor to Sanyo Electric Co., Ltd., Moriguchi-shi, Japan, a corporation of Japan Filed July 7, 1965, Ser. No. 470,087
Claims priority, application Japan, July 7, 1964, 39/38,789, 39/78,791; July 18, 1964, 39/41,052
Int. Cl. H04b *1/16*
U.S. Cl. 325—317 9 Claims

ABSTRACT OF THE DISCLOSURE

A combined FM-AM receiver in which the variable tuning capacitors for the AM antenna and AM converter are respectively used as capacitors for the FM input signal and FM local oscillator when the receiver is operated in the FM mode. In the FM mode a respective correcting capacitor is connected to each of the variable capacitors. In the FM mode the AM converter operates as an FM intermediate frequency stage and a coupling circuit including a capacitor is used to minimize reaction between the FM intermediate frequency signal and the AM input signal from the antenna. The AM-FM changeover switch also operates when in the AM position to short out the FM intermediate frequency tuned circuit and when in the FM position to connect the AM intermediate frequency tuned circuit as a power supply filter for at least a portion of the FM receiver.

Figures 1, 2:
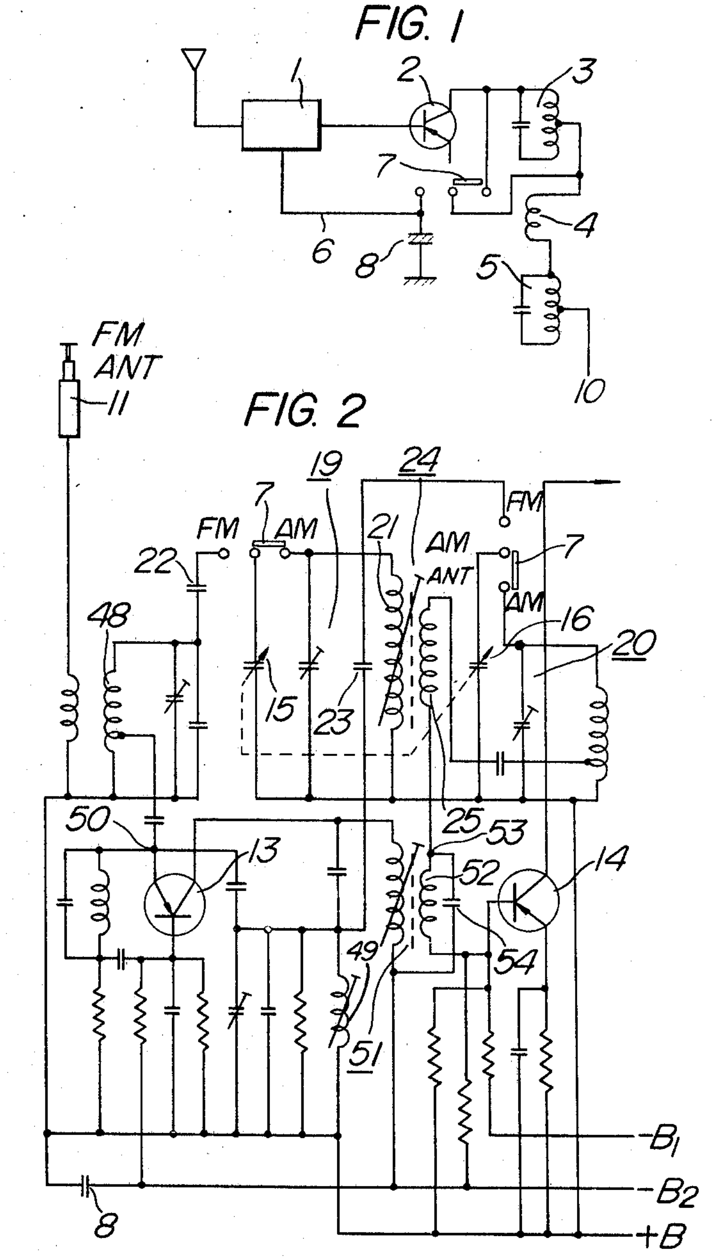

This invention relates to radio receivers and more particularly to a novel combined frequency modulation and amplitude modulation radio receiver.

Superheterodyne type FM or AM radio receivers have previously been in wide use and available in different designs. However, many difficulties have been involved in combining the functions of such FM and AM radio receivers. Any satisfactory FM-AM radio receiver, adapted to selectively receive FM and AM waves for enabling listeners to enjoy FM or AM programs as desired, cannot be formed by simply putting together an FM and an AM receiver in one unit.

In addition, various considerations must be taken to obtain a combined FM-AM radio receiver of good performance which is compact in size and concise in circuit arrangement.

According to the present invention, a compact combined FM and AM radio receiver of high performance can be obtained by transistorizing an FM-AM receiver typically disclosed, for instance, in U.S. Pat. No. 3,090,918 and employing as many circuits and component parts as possible in common to FM and AM reception.

Combined FM and AM radio receivers initially proposed included an audio frequency amplifier, and a sound reproducer both used in common to FM and AM reception, and separate detector means and preceding components. The latter included, on one hand, an FM discriminator, an FM intermediate frequency amplifier, an FM frequency converter (local oscillator and mixer functions combined in one tube or transistor) and an FM high-frequency amplifier for FM reception, and, on the other hand, an AM detector, an AM intermediate-frequency amplifier, an AM frequency converter (mixer and local oscillator) and an AM high-frequency amplifier for AM reception.

This type of radio receiver, however, has involved various problems.

A first problem of such receiver is that of manufacturing cost accompanying the use of duplicate components or increased number of elements combining FM-AM receivers in one unit.

Another problem is the extreme bulk of the receiver necessarily resulting from the use of duplicate components or increased number of elements combining FM-AM receiver in one unit and this makes it very difficult to design a compact portable receiver of high quality of this general type.

A further problem is that sound distortion or unusual oscillation is caused by the mutual interference between FM and AM signal waves, which is unavoidable due to the stray capacity formed between the wirings of the FM and AM reception circuits or the leakage flux of the coupling transformers.

Another problem of the early type FM and AM radio receiver is that it tends to cause "howling" on account of the separate use of capacitors in the FM and AM tuning circuits.

Also, there is a problem of undesired radiation caused by the increased circuit density of both the FM and AM circuits.

At the next stage of development, the combined FM and AM receiver has employed in common to the FM and AM circuits an intermediate-frequency amplifier, in addition to the audio-frequency amplifier and the sound reproducer both previously used in common, as disclosed in U.S. Pat. No. 3,090,918.

This has eliminated the above deficiencies accompanying the earlier type of receiver to a more or less extent but most of the problems have remained unsolved particularly in connection with the transistorization of the receiver.

The present invention is intended to solve problems involved in previous combined FM and AM radio receivers.

One feature of the present invention is the use of a correction circuit which enables the tuning capacitor employed in the AM input tuning circuit and the AM local oscillation circuit to serve also as a tuning capacitor for the FM input tuning and local oscillation circuits thereby to reduce the cost of manufacture and the size of the receiver while reducing howling, undesired radiation and mutual interference between the FM and AM waves.

Another feature of the present invention is the insertion between the ground and the junction between the circuits for taking an FM intermediate-frequency signal and an AM input signal, respectively, of a capacitor which has negligible effect relative to the AM input signal but is effective as a bypass capacitor relative the FM intermediate-frequency signal. The use of such capacitor directly makes it possible to eliminate one of the contacts of the FM-AM changeover switch used in prior art receivers and indirectly is effective to simplify the producing process while eliminating troubles such as mutual interference between the FM and AM waves and unusual oscillation.

A further feature of the present invention is the series connection of FM and AM intermediate-frequency tuning circuits to the output side of an AM frequency converter usable as an intermediate-frequency amplifier for FM reception, said AM frequency converter being operable, when the FM-AM changeover switch is in its position for FM reception, to cause said AM intermediate-frequency tuning circuit to act as a power source filter choke and for AM reception, to short-circuit said FM intermediate-frequency tuning circuit whereby the FM frequency converter during FM reception is kept practically free from the influence of any fluctuation of the source voltage and troubles including mutual interference between the FM and AM waves and unusual oscillation are effectively prevented.

Still further features of the present invention are, in combination with the inventions mentioned above, the use of a novel neutralizing circuit for the FM and AM intermediate-frequency amplifier circuits which do not employ any neutralizing coupling coil and need no special changeover switch, and the use of an output L circuit without an output transformer directly coupled to the receiver input as an audio frequency amplifier circuit.

Figure 3:
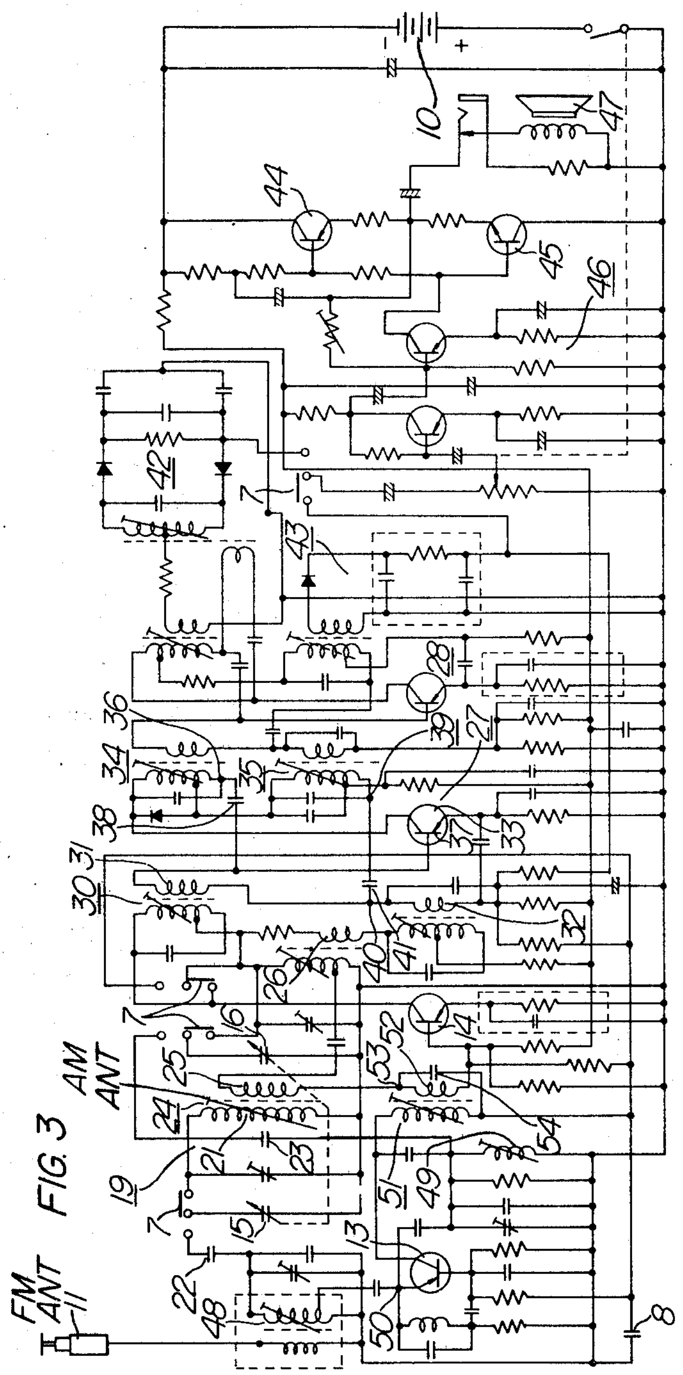

These and other features of the present invention in combination provide a compact FM and AM radio receiver of high performance, as will be apparent from the following description when read in conjunction with the accompanying drawings, in which:

FIG. 1 is a fragmentary block diagram illustrating one aspect of the present invention;

FIG. 2 is a circuit diagram illustrating the high-frequency part of an FM-AM receiver embodying further aspects of the present invention; and FIG. 3 is a circuit diagram of an entire FM-AM receiver constructed upon the basis of the arrangements shown in FIGS. 1 and 2 and forming a novel combination with an intermediate-frequency neutralizing circuit, which is advantageously usable in the combined FM and AM type of receiver, as described hereinbefore, and with a so-called series-connected OTL circuit such as heretofore preferably employed in audio-frequency circuits.

Referring to the drawings and first to FIG. 1, reference numeral 1 indicates an FM tuner; 2 indicates a transistor used both for FM and AM reception which is operable for AM reception as an AM frequency converter (combined mixer and local oscillator) and for FM reception as an FM intermediate-frequency amplifier; 3 indicates an FM intermediate-frequency tuning circuit; 4 an exciting coil for exciting AM and FM local oscillation coils (not shown); 5 indicates an AM intermediate-frequency tuning circuit; 6 indicates a circuit wiring for supplying an operating power from a suitable source 10 (not shown) to the FM tuner 1; and 7 indicates a changeover switch operable between positions for FM and AM reception.

In this circuit arrangement, when the FM-AM changeover switch 7 is positioned to the left for FM reception, the primary side of the FM intermediate-frequency tuning circuit 3 is opened so that the tuning circuit acts as a 10.7 mc. intermediate-frequency tuning circuit and both the FM tuner 1 and transistor 2 act to receive FM signals. Operating power for the FM tuner 1 is supplied thereto from source 10 through the AM intermediate-frequency tuning circuit 5, exciting coil 4 and switch 7.

The AM intermediate-frequency tuning circuit 5 and exciting coil 4, both connected in the power supply system, act as a filter and a choke coil, respectively, with respect to the operating power source so that the operation of the FM tuner 1 is highly stabilized.

Also, a capacitor 8 is connected to the circuit wiring 6 as shown and, together with said coil, forms a filter circuit relative to the ripple-current component.

It will be understood, therefore, that the coil components 4 and 5 in the power supply system cause no interference with FM signals received.

For AM reception, the power supply system for the FM tuner 1 is cut off by means of the changeover switch 7, which is moved to the right position, and simultaneously the FM intermediate-frequency tuning circuit 3 is short-circuited. Also, the exciting coil 4 and AM intermediate-frequency tuning circuit 5, inserted in the power supply system for the transistor 2, are connected in series with the latter so that the transistor 2 operates as an AM frequency converter in association with the exciting coil 4.

In this case, since the FM tuner 1 is completely disabled from the operating power source and the FM intermediate-frequency tuning circuit 3 is short-circuited, any disturbance or mutual interference of the FM signals with the AM signal amplifier system is effectively prevented.

Although separate FM-AM changeover switches heretofore have been inserted both in the power supply system for the FM tuner and in the common intermediate-frequency transmission system used by both the FM and AM receiver sections for selective reception of FM and AM signals, in the present invention only one changeover switch is required in each of the power supply and intermediate frequency systems and this simplifies the wiring connections of the receiver.

Referring next to FIG. 2, reference numeral 11 indicates an FM antenna; 24 indicates an AM antenna in the form of a bar antenna coil such as a ferrite antenna; 13 indicates an FM frequency converter; and 14 indicates a transistor used in common both for FM and AM reception corresponding to the transistor indicated by numeral 2 in FIG. 1.

In this circuit arrangement, with switch 7 in the AM position to the right, AM variable capacitors 15 and 16 are connected to an antenna tuning circuit 19 and a local oscillation circuit 20, respectively, to serve for AM reception as an ordinary AM variable capacitor. For FM reception, with switch 7 to the left correcting capacitors 22 and 23 serve the purpose of correcting the variable-capacitance curves and are connected in series with the variable capacitors 15 and 16, respectively, so that frequency-band range required to receive FM signals may be adequately covered using said AM variable capacitors in combination with the correcting capacitors 22 and 23.

The capacitances of the correcting capacitors 22 and 23 are designed according to the desired FM frequency band.

In a practical application of the present invention to FM-AM receivers, the capacitances of the capacitors 22 and 23 may be in the range of from 20 to 40 pf. for reception of AM signals of from 535 kc. to 1605 kc. and FM signals of from 70 to 106 mc.

The local oscillation frequency produced by FM frequency converter 13 during FM reception is determined by the combination of AM variable capacitor 16 and correcting capacitor 23 in series connection therewith to the emitter of the transistor 13.

Similarly, the tuning frequency of the antenna connected to the FM frequency converter 13 is determined by the combination of AM variable capacitor 15 and correcting capacitor 22 in series connection therewith and is led to the emitter of the transistor 13 for FM frequency conversion.

During FM reception, transistor 14 serves as an FM intermediate frequency amplifier by amplifying the signal at the collector output of FM frequency converter 13 which is applied to the base of transistor 14 through the tuned circuit 51.

During AM reception, the local oscillator frequency of AM frequency converter 14 is tuned by capacitor 16 while the AM antenna 24 is tuned by capacitor 15.

According to the present invention, there is no need of providing any separate variable capacitor for FM tuning since FM signals can be received by connecting correcting capacitors to the AM tuning variable capacitors for the purpose of correcting their variable-capacitance curves for FM reception, as described above. Also, the use of such correcting capacitors is very effective to prevent howling during FM reception because of the fact that any howling derivable from the oscillation in the tuning circuits and particularly unusual vibration of the variable capacitors therein is reduced to a reciprocal multiple of the correcting capacitances.

In the FM-AM receiver of the present invention, the AM tuning variable capacitors used therein are intended also to serve as FM tuning variable capacitors. In this connection, it may seem possible to use FM tuning variable capacitors in a manner such that it also serves as AM tuning variable capacitors, but such use of FM tuning variable capacitors is preferably avoided since it causes tracking error and other problems as the AM broadcast band usually includes frequencies ranging from the lowest of 535 kc. to the highest of 1605 kc., which is thrice the lowest, while the FM broadcast band includes the highest frequency of 106 mc. which is less than twice the lowest of 70 mc., as mentioned hereinbefore.

As a further development, there is provided according to the present invention a multiband receiver which includes variable tuning capacitors designed basically for reception of one of the broadcast bands which is the highest in highest-to-lowest frequency ratio and correcting capacitors connectible to said variable capacitors for selective reception of the other broadcast bands. With this arrangement, the different broadcast bands can be received in quite the same manner as with conventional receivers employing variable capacitors for each of the broadcast bands and improved characteristics are obtainable particularly with respect to the howling.

FIG. 3 illustrates the entire circuit arrangement of a combined FM and AM radio receiver embodying the present invention and in this figure parts corresponding in function to those shown in FIG. 2 bear the same reference numerals as used therein.

For AM reception, the FM-AM changeover switch 7 is positioned as illustrated. The incoming waves are secondarily tuned by variable tuning capacitor 15, which cooperates with the tuning coil 21, and the input signal induced in the receiving coil 25 of a ferrite core bar antenna 24 is mixed with the local oscillation voltage as excited by an exciting coil 26 and applied to the base of the transistor 14.

The intermediate-frequency output of the transistor 14 is fed to intermediate-frequency amplifiers 27 and 28 in the next stage through the AM intermediate-frequency tuning circuit selectively connected by the FM-AM changeover switch 7. The operation of the right hand section of changeover switch 7 in the AM position simultaneously interrupts the power supply to the FM frequency converter 13 by removing the voltage on the line connected to capacitor 8 through which coil 51 is connected to the collector of transistor 13 and short-circuits the FM intermediate-frequency tuning circuit 30 so that any mutual interference between F Mand AM signals may be reduced.

Another feature of the FM-AM radio receiver lies in use of a neutralizing circuit in combination with the FM-AM intermediate-frequency amplifier circuit. Namely, an FM input coil 31 and an AM input coil 32 are connected in series circuit and to the base of a common emitter type intermediate-frequency amplifier transistor 33. Connected to the output side are FM-AM intermediate-frequency tuning circuits 34 and 35. A capacitor 41 of capacitance $C_1$ is connected between the power side terminal 36 of the FM intermediate-frequency tuning circuit 34 and the base 37 of intermediate-frequency amplifier transistor 33 for the purpose of neutralizing the capacitance $C_{bc}$ between the base and collector of the transistor 33 for FM reception and another capacitor 42 of capacitance $C_2$ is connected between the power side terminal 39 of the AM intermediate-frequency tuning circuit 35 and the junction 40 between the FM and AM input coils 31 and 32 and has a value equal to the sum of the capacitance values $C_{bc}$ and $C_1$.

In this manner, perfect neutralization is effected with respect to both FM and AM intermediate-frequency signals without necessitating any special changeover switch or neutralizing winding. An AM detector 43 and an FM discriminator 42 are separately provided for AM and FM signals, respectively, and are selectively inserted in circuit by operation of the changeover switch 7 described above, and intermediate-frequency signals as amplified by intermediate-frequency amplifiers 27 and 28, which are provided with limiter circuits when required, are detected for AM reception by the AM detector 43 to form an audio-frequency signal.

This audio-frequency signal is amplified by an audio-frequency amplifier 46, which is connected directly to the last stage of the FM and AM demodulating circuits 42 and 43 and employs an OTL circuit such as single ended push-pull circuit including transistors 44 and 45 instead of using input and output transformers, and is fed to drive a sound reproducer 47.

For FM reception, the FM-AM changeover switch 7 is set into a position opposite to that for AM receiption described above. FM waves thus induced in antenna 11 are tuned in one of AM tuning variable capacitor 15, which cooperates with a tuning coil 48 and also serves the purpose of FM reception, and is applied to the emitter 50 of the FM frequency converter transistor 13 together with the local oscillation voltage, the frequency of which is determined by the other AM tuning variable capacitor 16, which cooperates with a tuning coil 49 and also serves the purpose of FM reception. As illustrated, correcting capacitors 22 and 23 are connected in series with the AM tuning variable capacitors 15 and 16, respectively, for the purpose of correcting their variable-capacitance curves.

The intermediate-frequency output of the FM frequency converter transistor 13 is directed through a coupling transformer 51 to the base of the FM-AM transistor 14. In this connection, a capacitor 54 is connected at one terminal to the junction 53 between the AM antenna pickup coil 25 and FM intermediate-frequency input coil 52 and at the other terminal to the ground and has a capacitance negligible relative to the AM input frequency signal but effective as a bypass capacitor relative to the FM intermediate-frequency signal. This arrangement dispenses with any FM-AM changeover switch for this stage and reduces troubles including mutual interference between FM and AM waves and unusual oscillation.

The circuit connection on the output side of the transistor for combined FM and AM use has already been described hereinbefore and the operation of the later stages is substantially the same as that described hereinbefore in connection with AM reception and is believed not to require any further description.

Though one embodiment of the invention has been described and shown herein, it will be apparent to those skilled in the art that various changes and modifications may be made without departing from the scope and spirit of the invention as defined in the appended claims.

What is claimed is:

1. A superheterodyne type radio receiver operating from a power supply and adapted to selectively receive FM arnd AM waves comprising AM frequency converter means which includes on its output side a series connected FM intermediate-frequency tuning circuit means and an AM intermediate-frequency tuning circuit means, AM-FM switch means for selectively operating said AM frequency converter as an FM intermediate-frequency amplifier and connecting said AM intermediate-frequency tuning circuit to said power supply as a filter choke when the FM-AM switch is positioned for FM reception, said switch means normally operating said AM frequency converter and short circuiting said FM intermediate-frequency tuning circuit means when the switch is positioned for AM reception.

2. In a superheterodyne type radio receiver which operates from a power supply and is adapted to receive and selectively reproduce information from FM and AM wave signals, the combination comprising an AM input tuning circuit means including a first variable capacitor for receiving an AM signal, an AM frequency local oscillator circuit means including a second variable capacitor, said first and second variable capacitors having capacitance values primarily selected for operating over the frequency band of one of said wave signals, an AM frequency converter circuit means connected to both said AM input tuning circuit means and said AM local oscillator means for producing an AM intermediate-frequency signal, an FM input tuning circuit means including said first variable capacitor and a first correcting capacitor for receiving the FM wave signals, an FM frequency local oscillator circuit means including said second variable capacitor and a second correcting capacitor, an FM frequency converter circuit means connected to both said FM input tuning circuit means and said FM local oscillator circuit means for producing an FM intermediate-frequency signal, and changeover switch means operable between two positions for FM and AM reception, said changeover switch operable when positioned for FM reception for respectively connecting said first and second variable capacitors in said FM tuning circuit means and said FM local oscillator means and for respectively connecting said first and second correcting capacitors to said first and second variable capacitors to correct the variable-capacitance curves and capacitance values of said first and second variable capacitors to those for FM reception and thus utilize said variable capacitors for FM wave signal reception over the FM frequency band as well as for AM wave signal reception over the AM frequency band, said changeover switch operable when positioned for AM reception for respectively connecting said first and second variable capacitors in said AM tuning circuit means and said AM local ocsillator circuit means.

3. A combined FM and AM radio receiver as claimed in claim 2 further comprising means for receiving an AM input signal, means at the output of said FM frequency converter circuit means tuned to the FM intermediate frequency signal produced by said FM converter means, means for connecting the output of said AM signal receiving means and said FM frequency converter circuit means together at a junction at the input circuit of said AM frequency converter means which operates as an FM intermediate-frequency amplifier during reception of FM waves when the changeover switch means is in the FM position, said AM frequency converter input circuit including a capacitor connected between a point of reference potential and the said junction, said capacitor having a substantial reactance relative to the AM input signal and being effective as a bypass capacitor relative to the FM intermediate-frequency signal.

4. A combined FM and AM radio receiver as claimed in claim 2 further comprising a series connection of an FM intermediate frequency tuning circuit means and an AM intermediate-frequency tuning circuit means at the output of said AM frequency converter, said changeover switch when in the FM position including further means for connecting said AM intermediate-frequency tuning circuit to said power supply to serve as a power source filter choke, said further means of said changeover switch short circuiting said FM intermediate-frequency tuning circuit means when positioned for AM reception.

5. A combined FM and AM radio receiver as claimed in claim 2 comprising AM antenna means, means for applying the signal from said AM antenna to a junction at the input circuit of said AM frequency converter circuit means, said FM frequency converter having an output FM intermediate-frequency signal pickup coil which is connected to said junction, a capacitor connected between a point of reference potential and said junction and having a substantially high reactance relative to the AM input signal frequency but effective as a bypass capacitor relative to the FM intermediate-frequency signal frequency, said AM frequency converter also having on its output side a series connected FM intermediate-frequency tuning circuit means and an AM intermediate-frequency tuning circuit means, said changeover switch means including means for selectively connecting said AM intermediate-frequency tuning circuit means to said power supply as a filter choke when the changeover switch is positioned for FM reception, said changeover switch means short circuiting said FM intermediate-frequency tuning circuit when the switch is positioned for AM reception.

6. A superheterodyne type radio receiver adapted to selectively receive FM and AM wave signals comprising circuit means for receiving an AM input signal, circuit means for producing an FM intermediate-frequency signal in response to a received FM wave signal, the outputs of said last two means being connected together at a junction, AM frequency converter means for operation as an FM intermediate-frequency amplifier during reception of FM wave signals, said AM frequency converter means including an input circuit having a capacitor with one terminal connected to the junction between the circuit means for receiving said AM input signal and the circuit means for producing the FM intermediate-frequency signal and the other terminal connected to a point of reference potential, said capacitor having a substantial reactance relative to the frequency of the AM input signal and being effective as a bypass capacitor relative to the frequency of the FM intermediate-frequency signal.

7. A combined FM and AM radio receiver as claimed in claim 6 operating from a power supply wherein said AM frequency converter means includes on its output side a series connected FM intermediate-frequency tuning circuit means and an AM intermediate-frequency tuning circuit means, AM-FM switch means for selectively connecting said AM intermediate-frequenucy tuning circuit as a filter choke for said power supply when the switch means is positioned for FM reception and for short circuiting said FM intermediate-frequency tuning circuit when the switch means is positioned for AM reception.

8. A superheterodyne type radio receiver operating from a power supply and of the type adapted to selectively receive FM and AM signal waves comprising: a changeover switch operable between positions for FM and AM reception, an AM frequency converter circuit means having an AM input tuning circuit means including a first variable capacitor and an AM local oscillation circuit means including a second variable capacitor cooperable with said first variable capacitor, FM frequency converter circuit means having FM tuning circuit means including one of said first and second variable capacitors and FM local oscillator circuit means including the other of said first and second variable capacitors, said changeover switch having means for connecting said first and second variable capacitors into the respective FM tuning circuit means and the FM local oscillator circuit means when the changeover switch is in the FM position and into the respective AM tuning circuit means and the AM local oscillator circuit means when the changeover switch is in the AM position, means for modifying the capacitance values of said first and second variable capacitor means, means for connecting said capacitance value modifying means to said first and second variable capacitors when said changeover switch is positioned for FM reception to correct the variable-capacitance values of said first and second variable capacitors to those required for FM reception and thus utilizing said variable capacitors primarily designed for AM reception as those for FM reception; means for receiving the AM signal waves, AM frequency converter means including an input circuit having a capacitor with one terminal connected at a junction between the output of the AM signal wave receiving means and the output of the FM frequency converter at which an FM intermediate-frequency signal appears, the other terminal of the capacitor being connected to a point of reference potential, said capacitor having a high reactance relative to the frequency of the AM input signal wave but effective as a bypass capacitor relative to the frequency of the FM intermediate-frequency signal, said AM frequency converter also including on its output side a series connected AM intermediate-frequncy tuning circuit means and an FM intermediate-frequency tuning circuit means, said changeover switch including means for connecting said AM intermediate-frequency tuning circuit to said power supply as a filter choke when the changeover switch is positioned for FM reception, said changeover switch also having means for short circuiting said FM intermediate-frequency tuning circuit when positioned for AM reception; a combined FM and AM intermediate-frequency transistor amplifier including a cascade connection to said AM frequency converter of input circuits for FM intermediate frequency signals of frequency $f_1$ and of AM intermedite frequency signals of frequency $f_2$, said combined amplifier tuning circuits also including a first neutralizing capacitance $C_1$ for neutralizing the collector capacitance $C_{bc}$ of the transistor at the AM intermediate-frequency of $f_1$ and a second neutralizing capacitance $C_2$ for neutralizing the sum of capacitances $C_{bc}$ and $C_1$ at the AM intermediate frequency of $f_2$; FM and AM detectors connected to said combined amplifier and selectively operable by the switch; an audio-frequency amplifier circuit having no input or output transformer connected to said detectors; and a sound reproducing device connected to said audio-frequency amplifier circuit.

9. In combination with a multiband radio receiver the improvement comprising a pair of variable tuning capacitors respectively connected in the input signal tuning circuits and the local oscillator circuits of the receiver whose capacitance values and tuning spread are selected primarily for reception and operation of the receiver at one of the bands which is the lowest in highest-to-lowest frequency ratio of two bands, a pair of correcting capacitors of fixed value one each for connection to a respective variable tuning capacitor to operate with a said variable tuning capacitor for selective reception and operation of the receiver on another band which is higher in frequency than said one low band, and switch means for connecting each of said correcting capacitors in series with a respective variable capacitor when the receiver is switched for operation from the lower to the higher frequency band of the two bands, said switch means also connecting said fixed and variable tuning capacitors to the respective input tuning circuits and local oscillator circuits for operation at the desired band.

References Cited

UNITED STATES PATENTS

| | | | |
|---|---|---|---|
| 2,561,087 | 7/1951 | Anderson | 325—315 |
| 3,090,918 | 5/1963 | Arguimbau | 325—315 XR |
| 3,201,695 | 8/1965 | Mason et al. | 325—315 |
| 3,206,680 | 9/1965 | Mason | 325—315 |
| 3,327,218 | 6/1967 | Enami | 325—315 |

ROBERT L. GRIFFIN, Primary Examiner

R. S. BELL, Assistant Examiner

U.S. Cl. X.R.

325—491